(12) United States Patent
Moeller et al.

(10) Patent No.: US 8,212,560 B2
(45) Date of Patent: Jul. 3, 2012

(54) RF PULSE DISTORTION CORRECTION

(75) Inventors: Steen Moeller, St. Louis Park, MN (US); Michael G. Garwood, Medina, MN (US); Curtis A Corum, Shoreview, MN (US); Djaudat S. Idiyatullin, Minneapolis, MN (US)

(73) Assignee: Regents of the University of Minnesota, St. Paul, MN (US)

( * ) Notice: Subject to any disclaimer, the term of this patent is extended or adjusted under 35 U.S.C. 154(b) by 319 days.

(21) Appl. No.: 12/384,888

(22) Filed: Apr. 9, 2009

(65) Prior Publication Data
US 2009/0257634 A1 Oct. 15, 2009

Related U.S. Application Data

(60) Provisional application No. 61/043,984, filed on Apr. 10, 2008.

(51) Int. Cl.
*G01V 3/00* (2006.01)
(52) U.S. Cl. .................................................. 324/309
(58) Field of Classification Search .......... 324/300–322; 600/410–435; 382/100–150
See application file for complete search history.

(56) References Cited

U.S. PATENT DOCUMENTS

| | | | | |
|---|---|---|---|---|
| 7,002,342 B2* | 2/2006 | Duerk et al. | ................... | 324/307 |
| 7,830,144 B2* | 11/2010 | Duerk et al. | ................... | 324/307 |
| 8,111,068 B2* | 2/2012 | Duerk et al. | ................... | 324/307 |
| 2008/0056549 A1 | 3/2008 | Hamill et al. | | |

OTHER PUBLICATIONS

Böhlen, J.-M., et al., "Experimental Aspects of Chirp NMR Spectroscopy", *Journal of Magnetic Resonance, Series A*, 102, (1993), 293-301.
Chan, F., et al., "Effects of RF Amplifier Distortion on Selective Excitation and Their Correction by Prewarping", *Magnetic Resonance in Medicine*, 23, (1992), 224-238.
Dadok, J., et al., "Correlation NMR Spectroscopy", *Journal of Magnetic Resonance*, 13, (1974), 243-248.
Ernst, R. R., et al., "Application of Fourier Transform Spectroscopy to Magnetic Resonance", *The Review of Scientific Instruments*, 37(1), (1966), 93-102.
Ernst, R. R., "Sensitivity enhancement in magnetic resonance", *Adv. Magn. Reson.*, 2, (1966), 1-135.
Garwood, M., et al., "The Return of the Frequency Sweep: Designing Adiabatic Pulses for Contempory NMR", *Journal of Magnetic Resonance*, 153 (2), (2001), 155-177.
Gupta, R. K., et al., "Rapid Scan Fourier Transform NMR spectroscopy", *Journal of Magnetic Resonance*, 13, (1974), 275-290.
Idiyatullin, D., et al., "Fast and quiet MRI using a swept radiofrequency", *Journal of Magnetic Rresonance*, 181, (2006), 342-349.
Jackson, J. I., et al., "Selection of a Convolution Function for Fourier Inversion Using Gridding", *IEEE Transactions on Medical Imaging*, 10(3), (1991), 473-478.
Ke, Y., et al., "Adiabatic DANTE Sequence for $\beta_1$-Insensitive Narrowband Inversion", *Journal of Magnetic Resonance*, 96(3), (1992), 663-669.

(Continued)

*Primary Examiner* — Dixomara Vargas
(74) *Attorney, Agent, or Firm* — Schwegman, Lundberg & Woessner P.A.

(57) ABSTRACT

This document discloses, among other things, a method for removing a bullseye artifact from a radial image generated using magnetic resonance and using a swept frequency pulse.

30 Claims, 13 Drawing Sheets

OTHER PUBLICATIONS

Kunz, D., et al., "Use of frequency-modulated radiofrequency pulses in MR imaging experiments", *Magnetic Resonance in Medicine*, 3(3), (2005), 377-384.

Michaeli, S., et al., "Exchange-Influenced $T_{2\rho}$ Contrast in Human Brain Images Measured with Adiabatic Radio Frequency Pulses", *Magnetic Resonance in Medicine*, 53(4), (2005), 823-829.

Michaeli, S., et al., "$T_{1\rho}$ MRI contrast in the human brain: Modulation of the longitudinal rotating frame relaxation shutter-speed during an adiabatic RF pulse", *Journal of Magnetic Resonance*, 181, (2006), 135-147.

Norris, D. G., "Adiabatic radiofrequency pulse forms in biomedical nuclear magnetic resonance", *Concepts in Magnetic Resonance*, 14(2), (2002), 89-101.

Pauly, J., et al., "A k-space analysis of Small-Tip-Angle-Excitation", *Journal of Magnetic Resonance*, 81, (1989), 43-56.

Silver, M. S., et al., "Selective spin inversion in nuclear magnetic resonance and coherent optics through an exact solution of the Bloch-Riccati equation", *Physical Review A*, 31(4), (1985), 2753-2755.

Tannus, A., et al., "Adiabatic Pulses", *NMR in Biomedicine*, 10, (1997), 423-434.

Tannus, A., et al., "Improved Performance of Frequency-Swept Pulses Using Offset-Independent Adiabaticity", *Journal of Magnetic Resonance, Series A*, 120(1), (1996), 133-137.

* cited by examiner

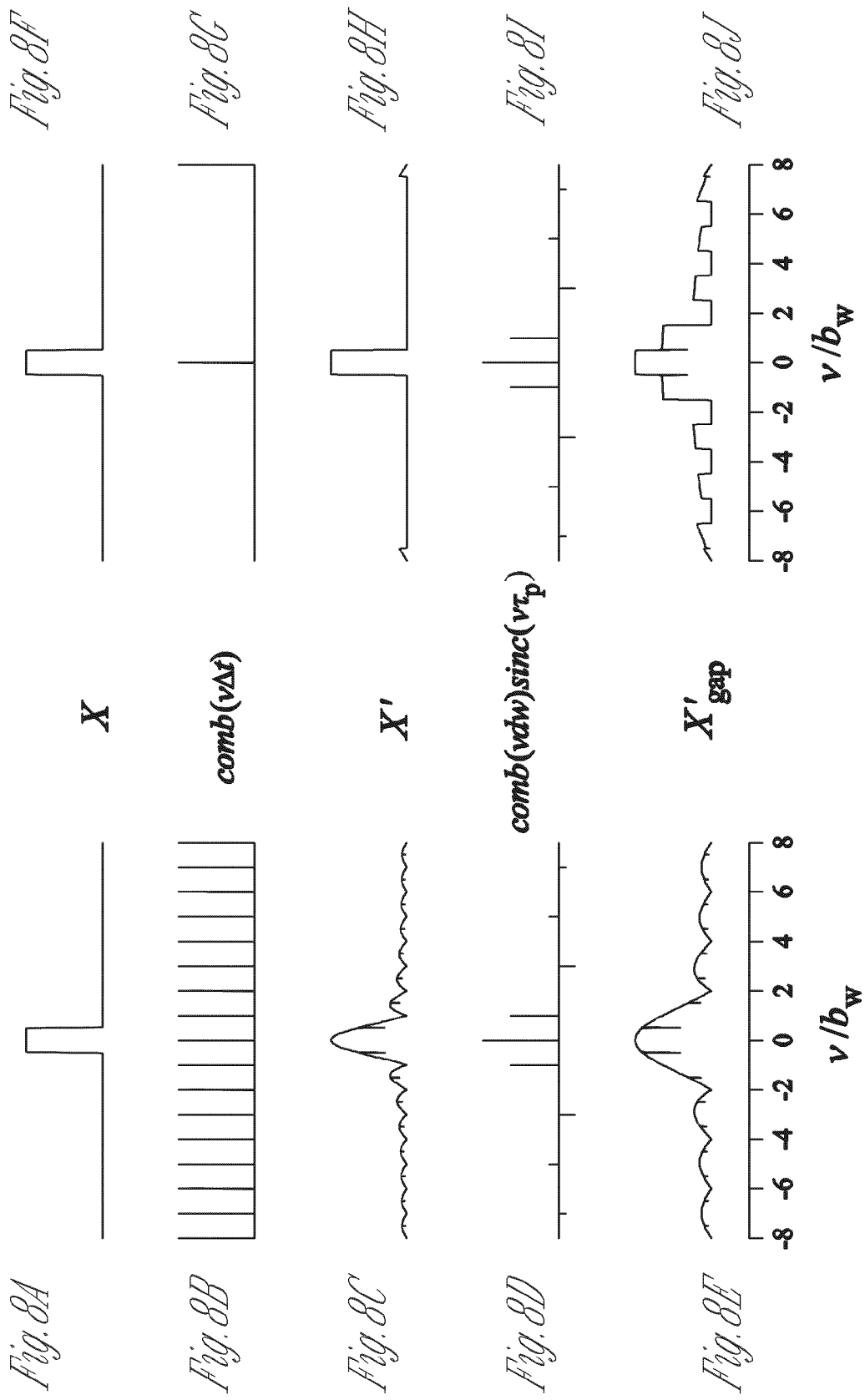

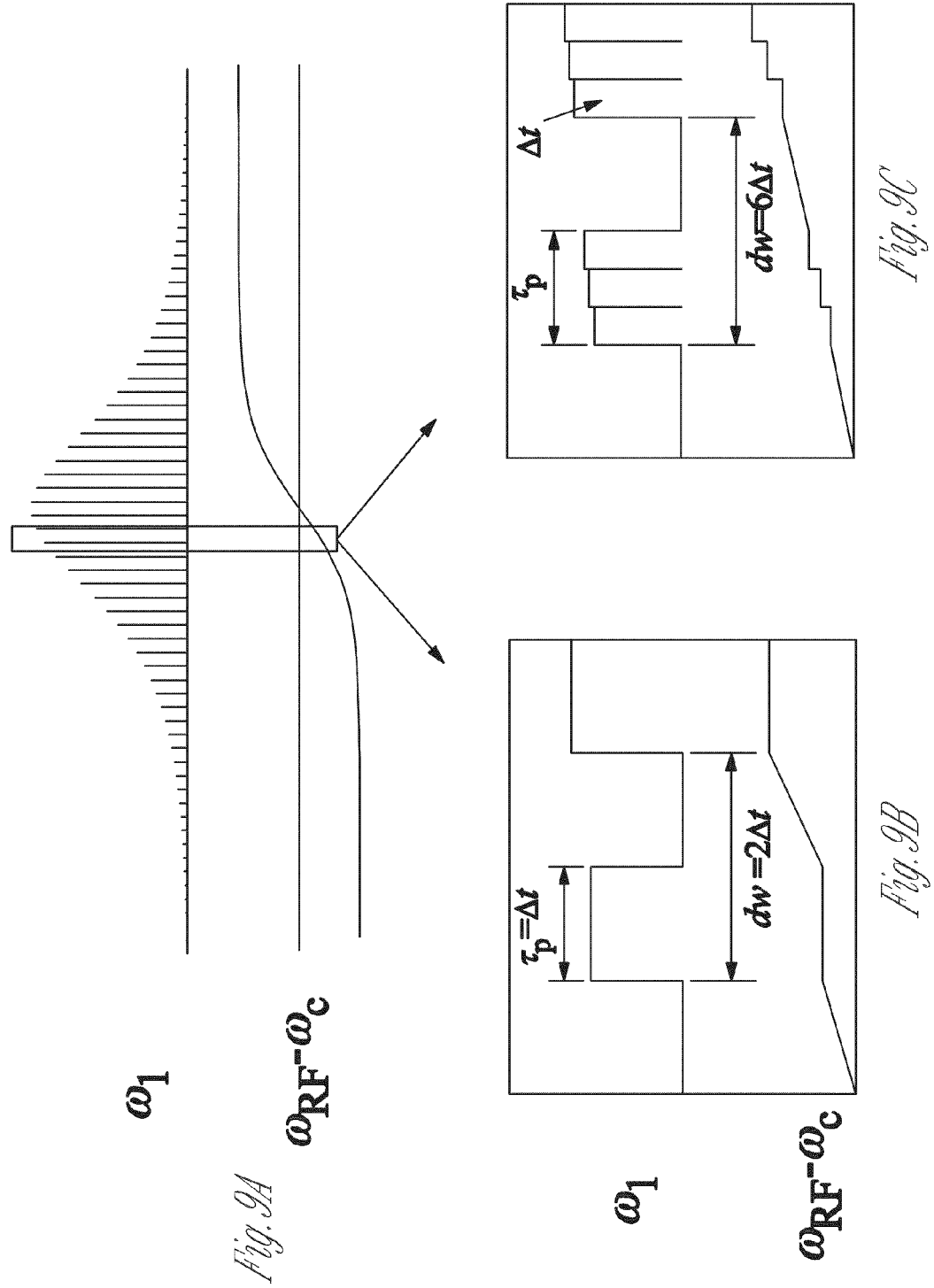

$L_{over} = 2$ $L_{over} = 4$ $L_{over} = 16$

RF PULSE DISTORTION CORRECTION

CLAIM OF PRIORITY

This patent application claims the benefit of priority, under 35 U.S.C. Section 119(e), to Moeller, U.S. Provisional Patent Application Ser. No. 61/043,984, entitled "RF PULSE DISTORTION CORRECTION," filed Apr. 10, 2008.

STATEMENT REGARDING FEDERALLY SPONSORED RESEARCH OR DEVELOPMENT

This invention was made with government support under award number BTRR P 41 RR008079 from the National Institutes of Health (NIH). The government has certain rights in this invention.

TECHNICAL FIELD

This document pertains generally to projection scanning, and more particularly, but not by way of limitation, to radio frequency (RF) pulse distortion correction in magnetic resonance.

BACKGROUND

An image acquired with radially distributed projections can sometimes include undesirable artifacts. A variety of factors can cause artifacts. Some artifacts can be ignored and yet other artifacts can render an image useless or lead to a misdiagnosis.

One example of an image artifact resembles a bullseye.

OVERVIEW

The present subject matter includes a system and a method for correcting a bullseye artifact that may appear in a radial image generated, for example, using the magnetic resonance protocol referred to as SWIFT. The SWIFT protocol, derived from swept imaging with Fourier transform, uses a frequency modulated pulse to accomplish nearly simultaneous excitation and reception.

The image can be corrected using a calculation performed in the time domain or using a calculation performed in the frequency domain.

One method of correcting the image includes receiving magnetic resonance data corresponding to a measured projection of an image formed using a frequency modulated excitation signal. A ratio is generated using the average of different projections and a filtered average projection. The corrected projection is generated in the frequency domain by multiplying the measured projection with the ratio.

In one example, a method includes receiving image data including a radial projection of an object. In addition, the method includes determining a ratio of an average projection and a filtered average projection using the image data and calculating corrected data using the ratio and the image data.

In one example, a method includes pre-compensating the image data using a factor including an inverse of time. The corrected data can be determined by calculating a product (in the frequency domain) or by calculating a convolution (in the time domain).

The image data can include magnetic resonance data. One example includes estimating a persistent distortion in a magnetic resonance excitation signal. Estimating the persistent distortion can include using a Fourier transform (FT).

The magnetic resonance data can be generated by providing an adiabatic excitation pulse to the object. The magnetic resonance data can be generated using SWIFT protocol. The image data can be generated by measuring a system response independent of an excitation signal provided to the object. The system response can be measured by using a sniffer coil. In one example, a sample port is used to measure the system response. The sample port can provide feedback as to imperfections in the excitation signal delivered to the object.

In one example, determining the ratio includes determining the filtered average projection using a band pass filter. A band pass filter can include a low pass filter. In addition, a band pass filter can include a Gaussian filter or a polynomial filter. The ratio can be determined by performing spline interpolation.

In one example, the corrected data is used to generate a corrected image.

In one example, the present subject matter includes a system having a memory and a processor. The memory is configured to receive image data corresponding to a radial projection of an object. The processor is coupled to the memory and configured to determine a ratio of an average projection and a filtered average projection using the image data and configured to calculate corrected data using the ratio and the image data.

The processor can be configured to calculate corrected data using at least one of multiplication in a frequency domain and convolution in a time domain. A display can be coupled to the processor and configured to render a visible image of the object using the corrected data. The processor can be configured to execute an algorithm to estimate a persistent distortion in an excitation signal provided to the object. The processor can be configured to implement a band pass filter (such as a low pass filter).

In one example, the present subject matter includes a machine-readable medium having machine executable instructions stored thereon that cause one or more processors to perform a particular method. The method can include receiving image data corresponding to a radial projection of an object. In addition, the method can include determining an average projection using the image data. The method can include determining a filtered average projection using the image data. The method can include calculating a correction factor using the average projection and the filtered average projection and adjusting the image data using the correction factor.

The method can include receiving magnetic resonance data corresponding to an adiabatic pulse. The method can include determining the filtered average projection by estimating the data perturbations. In one example, the method includes implementing a band pass filter. The filter can include a polynomial filter. In one example, adjusting the image data includes adjusting image intensity. In one example, receiving the image data includes receiving magnetic resonance data generated using SWIFT protocol. In one example, adjusting the image data includes at least one of multiplying in a frequency domain and convoluting in a time domain.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 8A-8J graphically illustrates selected components of particular equations.

FIGS. 9A-9C illustrates a SWIFT pulse sequence.

DETAILED DESCRIPTION

Certain excitation signals may lead to distortion in the received signal or generated image. For example, an image generated using a frequency swept pulse may include objectionable distortion appearing as a bullseye artifact.

Figure 1:
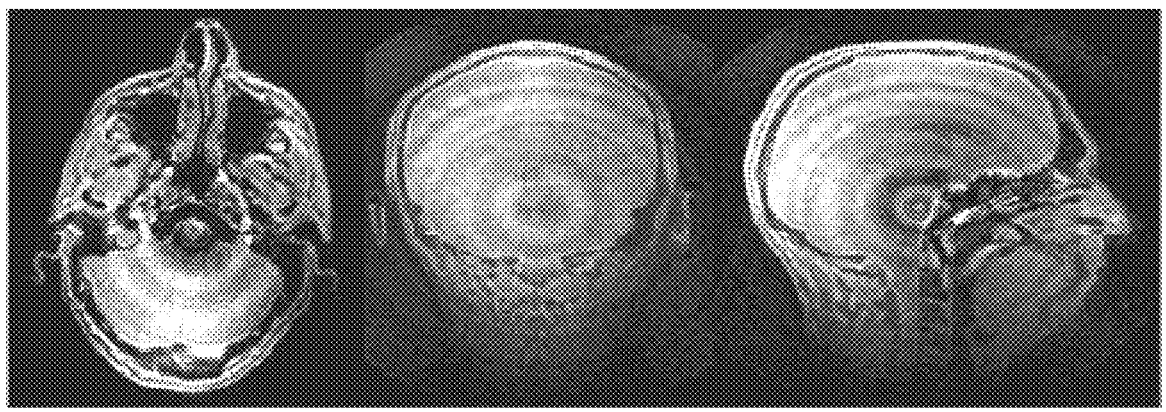
FIG. 1 includes a series of images that exhibit a bullseye artifact.

FIG. 1 includes a series of whole head images that exhibit a bullseye artifact. The whole head images illustrate good resolution and contrast. The three images in the figure are generated using MRI at 4T and were acquired using SWIFT with a hyperbolic secant (HS1) pulse, TR=6.1 ms, nominal flip angle=4°, 96000 independent spokes, FOV=35×35×35 cm, acquisition time≈10 min, isotropic resolution of 1.37× 1.37×1.37. The bullseye artifact appears as generally concentric rings of alternating dark and light regions.

Radial sampling depicts a projection that can be thought of as looking at a hub along a particular spoke of a wheel. The magnetic resonance scanner provides data representing the amplitude component and the phase component of an image. A Fourier transform can be used to shift between the time domain and the frequency domain. In radial imaging, gridding and an inverse Fourier transform of the k-space data yields an image. A Fourier transform of a projection yields a particular 'spoke' in radial k-space.

With the SWIFT protocol, for example, the shape of the excitation signal actually applied to a region of interest may differ from that which was intended. The excitation signal can be modeled using the intended signal and an error component. The error component can arise from non-linearities in the amplifier as well as other factors. In the present subject matter, the error is assumed to be temporally consistent and the image can be corrected by application of a suitable algorithm.

The bullseye artifact can be viewed as high frequency modulation over the bandwidth of the response. Accordingly, selection of a suitable filter for the system response can remove the high frequency component and provide a clean image. The filter can be selected to provide a smooth average projection.

In one example, the calculated data is multiplied by a low pass filtered average signal and divided by an unfiltered average signal.

In addition to SWIFT, other magnetic resonance sequences can be used for radial sampling and are thus correctable by the present subject matter. The present subject matter can be used with any magnetic resonance sequence that uses sequential excitement of different frequencies.

The 3D radial MRI technique known as SWIFT exploits a frequency modulated pulse to accomplish nearly simultaneous excitation and reception. SWIFT uses the concept that the resulting spectrum is expressible as the convolution of the resulting NMR signal with the RF-pulse that the spins experience. In this approach, removal of the RF pulse from the NMR signal through correlation (a.k.a. deconvolution) requires accurate knowledge of the RF waveform that the spins experience. Yet, due to distortions occurring in the transmitter channel, this function is typically different from the digital waveform that was requested. There are several sources for consistent distortions of the pulse shape including amplifier non-linearity and amplitude induced phase modulation, which can be compensated by amplifier mapping, and smaller phase delays in the resonant circuitry, which requires more challenging hardware solutions.

With SWIFT, persistent RF distortion is observable as a bullseye artifact, which can degrade image quality. The present subject matter includes a method for correcting these deleterious effects, without explicit knowledge of them or their origin.

TABLE 1

| | |
|---|---|
| $r(t) = h(t) \otimes x(t) \Leftrightarrow R(\omega) = H(\omega)X(\omega)$ | (1) |
| $H_{calc} = R/X_{exp}$ | (2) |
| $H_{calc} = (X/X_{exp})H$ | (3) |
| $\overline{H_{calc}} = \Sigma_{all\ views} H_{calc}\ \&\ \overline{\overline{H_{calc}}} = LP(\overline{H_{calc}}) \approx H$ | (4) |
| $H_{corrected} = \dfrac{\overline{\overline{H_{calc}}} H_{calc}}{\overline{H_{calc}}} = \dfrac{\overline{\overline{H_{calc}}}(X/X_{exp})H}{H(X/X_{exp})} \approx H$ | (5) |

The measured signal r(t) can be expressed as in Equation 1 of Table 1, where x(t) is the RF pulse that the spins experience, and h(t) is the free induction decay (FID) due to short pulse excitation (impulse response).

The correlation with an expected pulse function $x_{exp}(t)$ in the frequency domain gives a spectrum $H_{calc}$ (Equation 2), which is different from the spectrum of the spin system H (Equation 3). Here, the RF pulse distortions are considered as any persistent effect, i.e., $x(t)=x_{exp}(t)+\Delta x(t)$. For radial acquisitions, the persistent distortion of the RF pulse can be estimated from the data itself. The premise for doing this is that the average projection of all directions is smooth, and that the error is the same for all views.

The corrected projection can then be determined from Equation 5, which entails division with the average projection $\overline{H_{calc}}$ and multiplication with the filtered average projection $\overline{\overline{H_{calc}}}$.

A correction function can be determined as shown in Equation 1 of Table 1 and implemented in either the frequency domain or in the time domain. The correction function is defined as:

$$\text{correction function} \equiv H_{crf} = \dfrac{\overline{\overline{H_{calc}}}}{\overline{H_{calc}}}$$

The correction function can be applied in either the frequency domain using $H_{corrected}=H_{crf}H_{calc}$ or the correction function can be applied in the time domain as $_\vee H_{corrected}=_\vee H_{crf} \otimes {_\vee H_{calc}}$ where $_\vee H_{corrected}$ is the Fourier transform of $H_{corrected}$. The correction function can be expressed as a ratio and, in one example, is determined by performing a spline interpolation.

Figure 2:
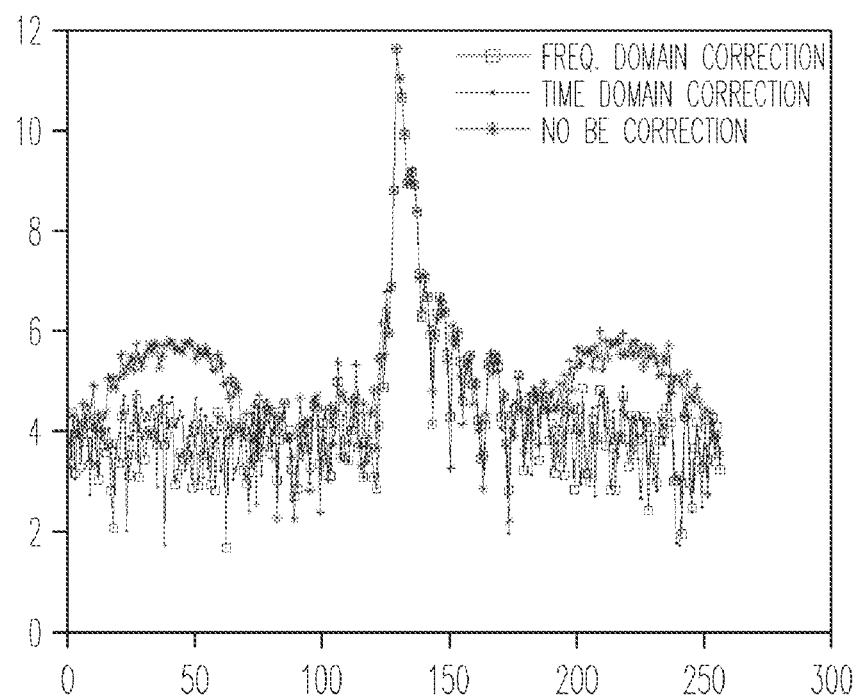
FIG. 2 illustrates bullseye artifact correction using time domain correlation.

FIG. 2 illustrates bullseye artifact correction using time domain correlation. In the figure, the abscissa shows the time domain after correlation and the ordinate denotes the logarithm of the signal amplitude. The line marked with * (asterisk) symbol illustrates the free induction decay (FID) after correlation and before bullseye artifact correction. In this line, the high spatial frequencies are attenuated. The line marked with □ (square shape) symbol is the FID after bullseye artifact correction in the frequency domain and the Fourier transformed to the time domain. In this line, the attenuation of the high frequencies in the FID is removed. The line The line with • (dot) symbol is the FID in the time domain after correlation with the bullseye correction function in the time domain. The bullseye correction function in the time domain is the Fourier transform of the "correction function" described above. In this line, the attenuation of the high frequencies in the FID is removed. The figure illustrates that the parallelism between the time domain and the frequency domain is imperfect for those signals having a finite duration.

Measurements from both 9.4T animal and 4T human systems, on which SWIFT is implemented, have been investigated for exhibiting these bullseye artifacts. In one example, the function $\overline{H_{calc}}$, which represents the low-pass filtering of $\overline{H_{calc}}$, was estimated with a strongly windowed FFT (a hamming window to the power 30). This was consistently found to remove the artifact. Corrections with standard hamming filtering and subsequent polynomial filtering (Savitzky-Golay, $5^{th}$ order and frame size 61) can also be used. The images of FIG. 1 were constructed using gridding with a Kaiser-Bessel function. Gridding with a Kaiser-Bessel function includes image reconstruction by interpolating the acquired data onto a Cartesian grid using a Kaiser-Bessel convolution kernel followed by fast inverse Fourier transform.

The function $\overline{H_{calc}}$ can be estimated with a FFT (fast Fourier transform) not described as "strongly windowed." Windowing refers to a technique used to shape the time portion of measurement data in order to reduce edge effects that result in spectral leakage in the FFT spectrum. A variety of window functions can be used with aperiodic data, such as that which may be encountered using the present subject matter. Criteria with which to select a particular window function can include, by way of examples, frequency resolution, spectral leakage, and amplitude accuracy.

Pulse imperfections due to electronic components and fundamental physical limitations are real and confounding factors for performing advanced MR experiments. Yet, with the future of MR tending toward non-Cartesian radial sequences and frequency swept pulses, corrections for such effects are needed. According to one theory, the dominant bullseye effect is caused by spins experiencing a distorted RF waveform. The present subject matter includes a data driven method for correction, thus leading to images of clinical quality.

Bullseye removal, according to the present subject matter, entails no additional acquisitions or modifications to existing protocols. Long range (low frequency) perturbations relative to the object can be realized as an intensity modulation, and can be correctable by intensity correction techniques—which can not handle high frequency modulations.

In addition to the post-processing technique, additional direct measurements of the RF pulse have shown that the solution of Equation 1 can be corrected by correlation using the measured RF.

In one example, the present subject matter is implemented using a filter having a particular pass band. The filter, as noted elsewhere in this document, can include a low pass filter in which a low frequency spectral component is passed with little or no attenuation and a high frequency spectral component is attenuated. In one example, the filter is configured to attenuate or remove the high (magnitude) spatial frequency components, (i.e. high positive and negative frequencies). The filter can include a Gaussian filter, a polynomial filter, or other type of filter.

In SWIFT, useful signal is extracted by correlation of the spin system response with the pulse function. Misrepresentation of the pulse function results in a systematic error in the resulting spectrum. Such a systematic error in radial imaging shows up in the reconstructed image as a bullseye artifact. To avoid such artifacts, the pulse function used for correlation must be as faithful as possible to the physical pulse transmitted by the RF coil. As shown herein, the bullseye artifact can be corrected by application of a correction function.

In one example, the pulse function applied is determined by a coil configured to detect an RF signal. The coil, sometimes referred to as a sniffer coil, can include a probe having a wound electrical element with sensitivity to the frequencies of interest. In one example, a sample of the signal is generated by a sample port coupled to the magnetic resonance system.

The present subject matter can be used with data corresponding to various types of imaging modalities and using various ways of calculating the multiplicative ratio factor used to remove the bullseye artifact. In one particular example, the present subject matter is used with magnetic resonance data. Other types of image data, besides magnetic resonance, can also be used with the present subject matter.

In addition, the ratio can be obtained using alternative methods. In one example, the ratio is generated using an average projection and a filtered average projection based on the data.

The excitation signal can be frequency modulated or it can be amplitude modulated. In one example, the excitation signal includes an adiabatic pulse.

In addition to using the received data, various methods can be used to determine the filtered average projection.

Figure 3:
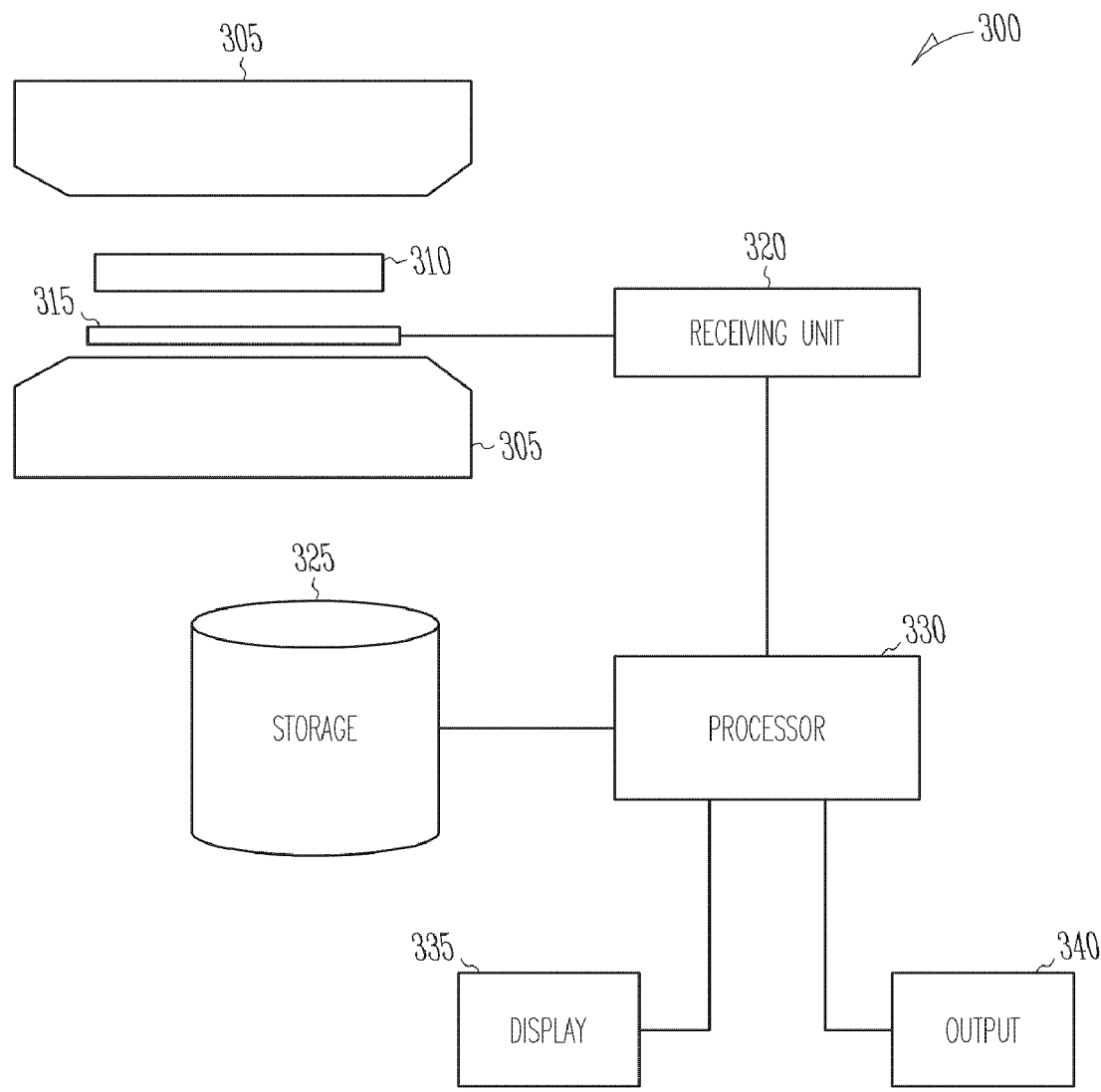
FIG. 3 includes a block diagram of an imaging system.

FIG. 3 includes a block diagram of imaging system 300. Imaging system 300, in this example, depicts a magnetic resonance system and includes magnet 305. Receiver coil 315 and object 310 are positioned within the field of magnet 305. Object 310 can include a human body, an animal, a phantom, or other specimen. Receiver coil 315, sometimes referred to as an antenna, provides a signal to receiving unit 320. Receiving unit 320 can include an analog-to-digital converter (ADC), a pre-amplifier, a filter, or other module to prepare the received signal for processing. Receiving unit 320 is coupled to processor 330.

Processor 330 can include a digital signal processor, a microprocessor, a controller, or other module to perform an operation on the signal from the receiving unit. Processor 330 is also coupled to storage 325, display 335 and output unit 340.

Storage 325 can include a memory for storing data. The data can include image data as well as results of processing performed by processor 330. In one example, storage 325 provides storage for executable instructions for use by processor 330. The instructions can be configured to implement a particular algorithm.

Display 335 can include a screen, a monitor, or other device to render a visible image corresponding to object 310. For example, display 335 can be configured to display a radial projection, a Cartesian coordinate projection, or other view corresponding to object 310. Output unit 340 can include a printer, a storage device, a network interface or other device configured to receive processed data.

Figure 4:
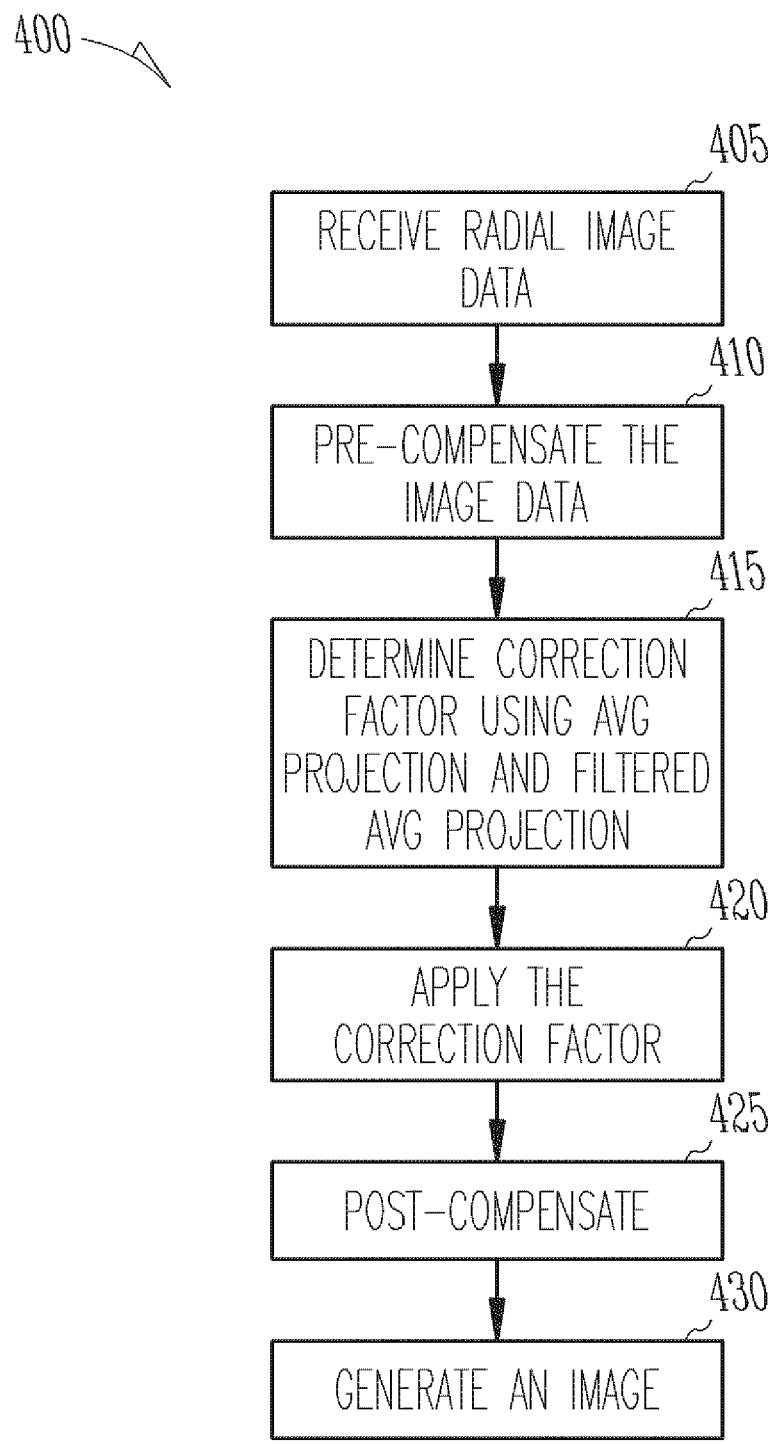
FIG. 4 includes a flow chart for adjusting an image.

FIG. 4 includes a flow chart of method 400 for adjusting an image. Method 400 represents an example of processing configured to correct a bullseye artifact in an image.

At 405, radial image data is received. The radial image can be derived from MR data or data derived using other image modalities such as ultrasonic, PET, or CT. The radial image data, in one example, is derived from an MRI system (such as system 300 of FIG. 3) configured to implement a SWIFT protocol of excitation and readout.

In the example shown, at 410, the image data is pre-compensated. Signal intensity varies from view to view, and pre-compensation can be applied to $H_{calc}(f)$ in order to reduce the amount of variation. In various example, the compensation function is either $1/t$ or $1/t^2$, and is applied in the time domain, as precompensated $H_{calc} = \hat{}((\check{}H_{calc})/t)$ or precompensated $H_{calc} = \hat{}((\check{}H_{calc})/t^2)$ where $\check{}H_{calc}$ is the Fourier transform and $\hat{}H_{calc}$ is the inverse Fourier transform.

At 415, the correction factor is determined. In one example, this includes determining a ratio of an average projection and a filtered average projection.

At 420, bullseye correction is performed on the pre-compensated data. After correction for RF imperfections (such as bullseye artifact), the data is post-compensated with the inverse correction factor (e.g. $t$ or $t^2$) at 425. Post-compensation entails recovery of the data for the corrected image.

In the example shown, at 430, the corrected image is generated using the compensated and bullseye corrected data.

Compensation (including pre-compensation and post-compensation) can be effective for removing outliers from the data. In addition, compensation can be applied in the frequency domain when the bullseye correction is performed in the time domain.

Variations in the method are also contemplated. For example, pre-compensation (at 410) and post-compensation (at 425) can be omitted in bullseye artifact correction. As such, the range of data remains un-compensated.

Figure 5A:
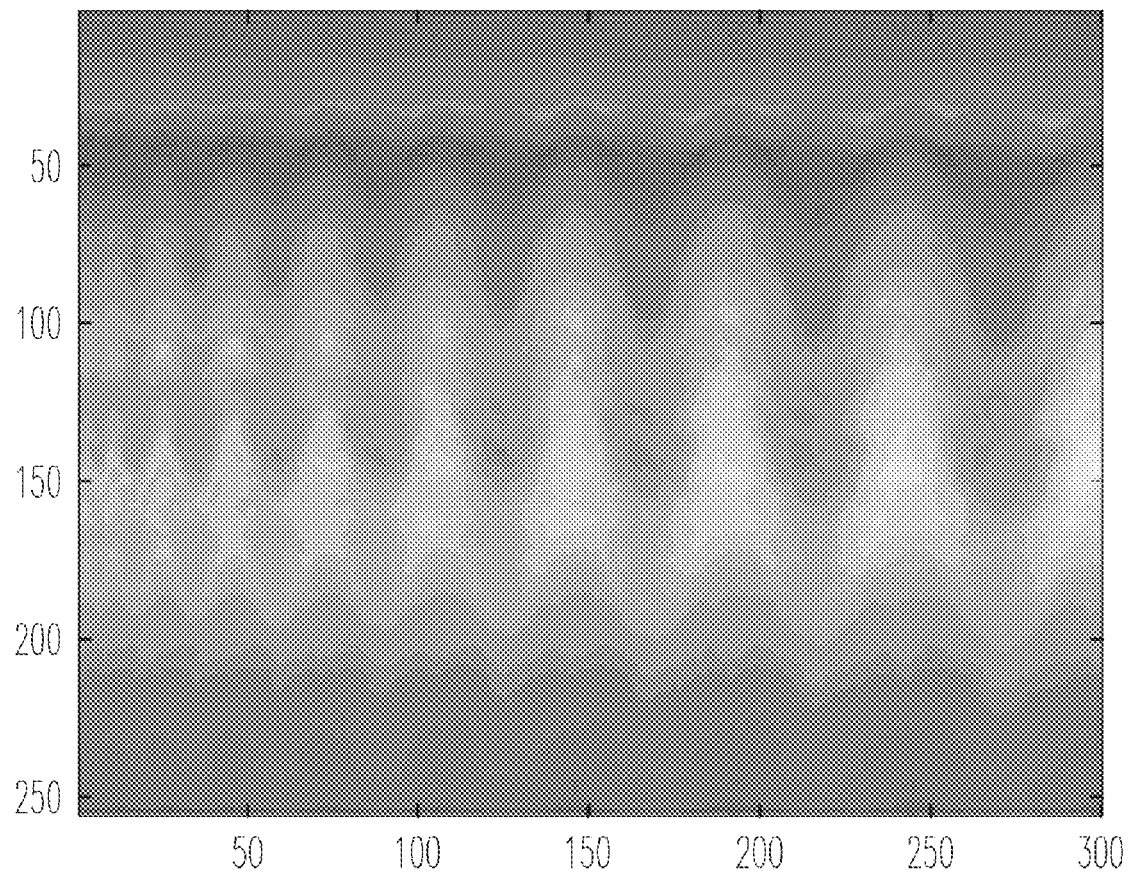
FIGS. 5A, 5B, and 5C include sinograms.
Figure 5B:
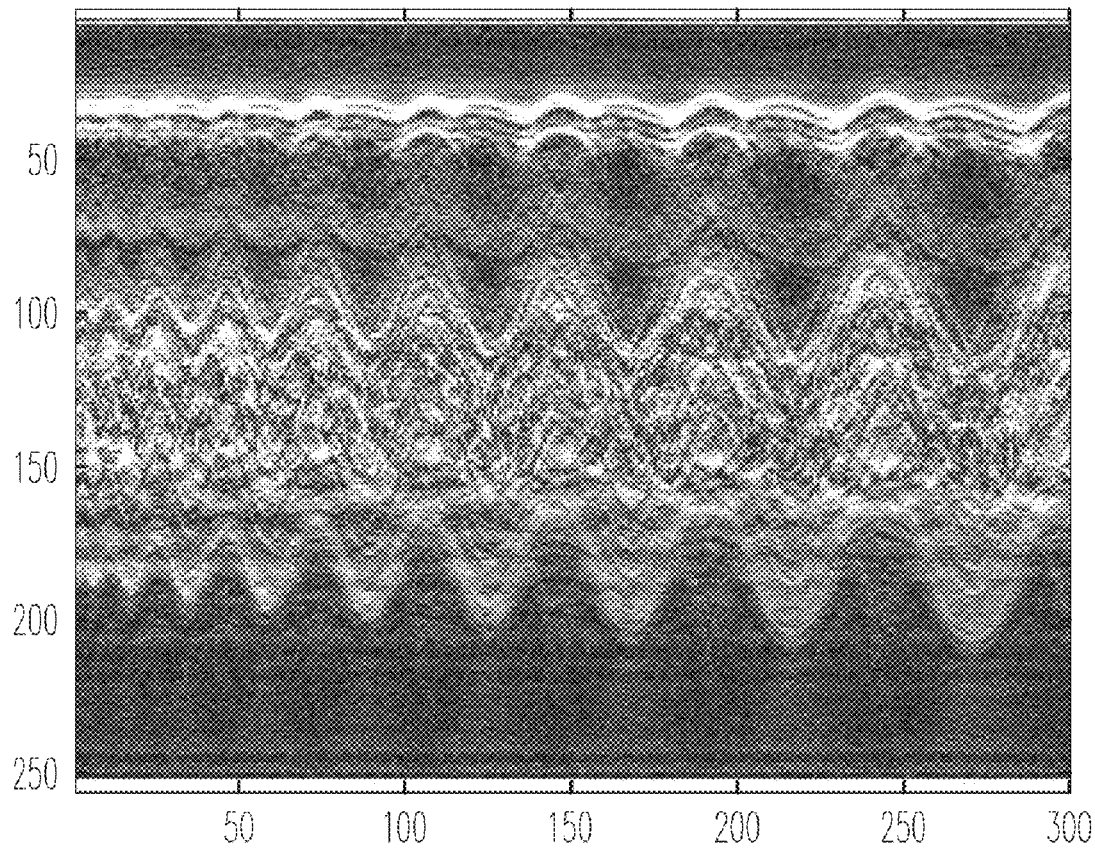
Figure 5C:
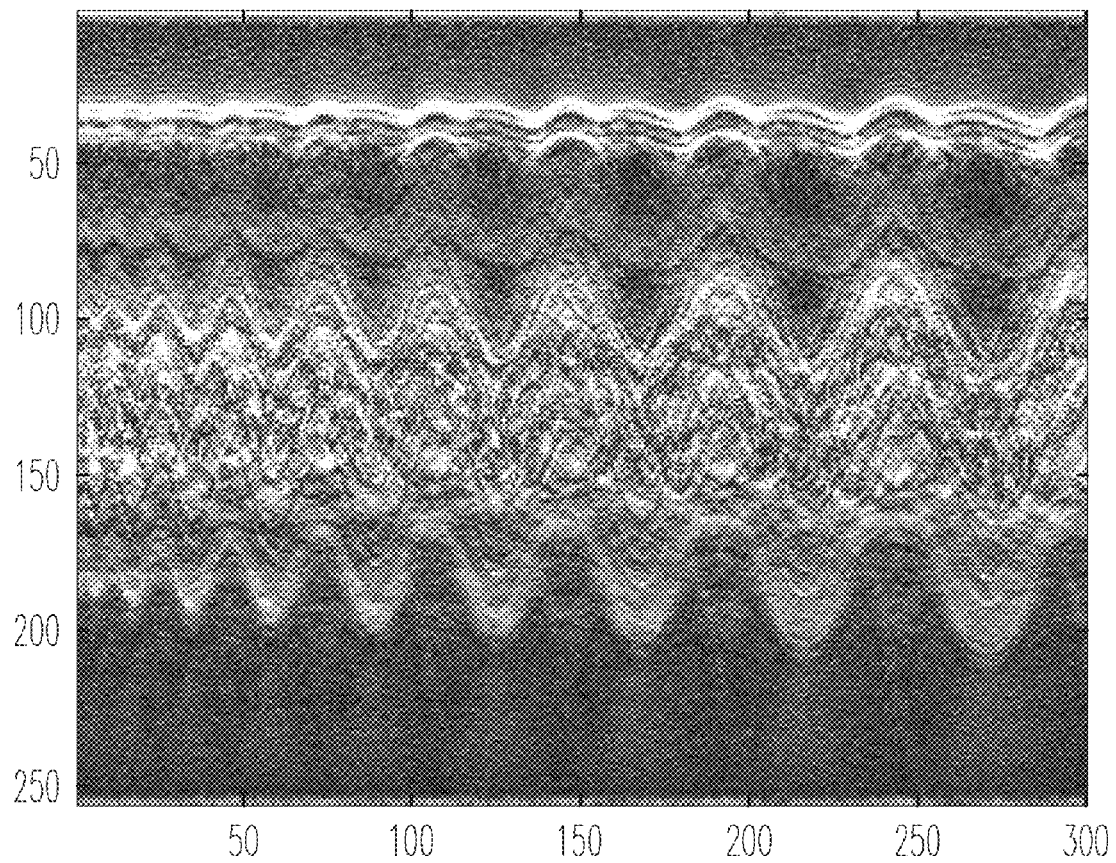

FIGS. 5A, 5B, and 5C illustrate sinograms corresponding to processing of the image data. A sinogram is a two-dimensional matrix that depicts consecutive projections on the abscissa and frequency on the ordinate. The sinograms shown illustrate the effects of compensation and bullseye correction. The sinogram data can be transformed to recover an image. For example, the sinogram can be transformed to a k-space representation and by application of a multi-dimensional Fourier transform, converted to an image.

FIG. 5A includes a sinogram representation in the frequency domain of image data for a radial projection. The data shown is uncompensated and not corrected for a bullseye artifact. The uncompensated signal intensity can vary, for example, from zero to 50,000. With such a range, the effects of an outlying data point can undesirable mask other intensity values and impair the image. In this view, the bullseye artifact appears as alternating horizontal bands of dark and light regions.

FIG. 5B includes a sinogram representation, also in the frequency domain, and using a $1/t$ pre-compensation factor in the time domain. As in the previous sinogram, the data shown is not corrected for a bullseye artifact. For example, the signal intensity shown may have a range of zero to 100, thus mitigating the effects of masking. In this view, the persistent signal intensity modulation (bullseye artifact) appears as alternating horizontal bands of dark and light regions.

FIG. 5C includes a sinogram representation, also in the frequency domain, having bullseye artifact correction. As in the previous sinogram, the data is pre-compensated using a $1/t$ factor. The absence of alternating horizontal bands in the sinogram foretells the absence of a bullseye artifact in the image.

The following portion describes gapped pulses for frequency-swept MRI.

Objects exhibiting extremely fast spin-spin relaxation rates can be imaged using a magnetic resonance (MR) method referred to as SWIFT (SWeep Imaging with Fourier Transform). SWIFT uses a frequency-swept excitation pulse and includes virtually simultaneous signal acquisition in a time-shared mode. Correlation of the spin system response with the excitation pulse function is used to extract the signals of interest. With SWIFT, image quality is related to uniform and broadband spin excitation. A frequency-modulated pulse belonging to the hyperbolic secant family (HSn pulses) can produce the excitation for SWIFT. This document describes implementation of SWIFT using HSn pulses and selected properties of HSn pulses in the rapid passage, linear region. This document also analyzes the pulses after inserting the "gaps" for time-shared excitation and acquisition, presents an expression to estimate the amplitude and flip angle of the HSn pulses and the relative energy deposited by a SWIFT sequence.

SWIFT uses correlation of the spin system response with the excitation pulse function in order to extract useful signal.

Images can be produced with SWIFT provided that the excitation is uniform over a bandwidth equal to the image acquisition bandwidth. Certain types of frequency-modulated (FM) pulses that function according to adiabatic principles can produce a broadband and flat excitation profile with low RF amplitude ($B_1$). Some FM pulses are suitable for inverting magnetization (i.e. adiabatic full passage (AFP)) and can also be used to excite lower flip angles while retaining essentially the same shape of the frequency-response profile. In contrast to adiabatic inversion, excitation with lower flip angles entails either decreasing $B_1$ or increasing the rate at which the time-dependent pulse frequency $\omega_{RF}(t)$ is swept. In doing so, the operating point is changed from the adiabatic region to the region known as the rapid passage, linear region, which satisfies the conditions:

$$\alpha T_2^2 >> 1 \tag{6A}$$

and $$\alpha >> (\omega_1/2\pi)^2, \tag{6B}$$

where $\alpha$ is the frequency acceleration in Hertz per second (i.e., $\alpha = (d\omega_{RF}/dt)/2\pi$), $T_2$ is spin-spin relaxation time in units of seconds, and $\omega_1$ is the amplitude of RF field in angular frequency units (i.e., $\omega_1 = \gamma B_1$, where $\gamma$ is the gyromagnetic ratio).

SWIFT can be implemented using a variety of shapes for the RF sweep function, and therefore, a variety of different kinds of FM pulses can be used. For example, SWIFT can be implemented using FM pulses belonging to a class of hyperbolic secant pulses known as HSn pulses.

Frequency-modulated HSn pulses can be used for adiabatic inversion (i.e., AFP pulses) with reduced peak amplitude relative to a hyperbolic secant (HS) pulse. The RF driving function $f_n(t)$ can be a modified HS function, $$f_n(t) = \text{sech}(\beta(2t/T_p - 1)^n), \tag{7}$$

where n is a dimensionless shape factor (typically $n \geq 1$), $\beta$ is a dimensionless truncation factor (usually $\beta \approx 5.3$), and $T_p$ is the pulse length (i.e., $0 \leq t \leq T_p$). The dimensionless relative integral I(n) and relative power P(n) of the driving function (Equation 7) can be obtained, but does not have a known analytic closed form expressions when n>1. For convenience, here approximations will be used which for $\beta \geq 3$ and $n \geq 1$ have 3% or better accuracy, such that:

$$I(n) = \frac{2}{T_p} \int_0^{T_p} f_n(\tau) d\tau \approx \left(\frac{\pi}{2\beta}\right)^{1/n} \quad (8A)$$

$$P(n) = \frac{2}{T_p} \int_0^{T_p} f_n^2(\tau) d\tau \approx \left(\frac{1}{\beta}\right)^{1/n}. \quad (8B)$$

For $n \to \infty$ the function $f_n(t)$ becomes a rectangle which describes the shape of chirp and square pulses with corresponding parameters equal to one, i.e., I=P=1.

In the case of HSn pulses, the time-dependent RF amplitude and angular frequency can be written as, $$\omega_1(t) = \omega_{1max} f_n(t), \quad (9A)$$

$$\omega_{RF}(t) = \omega_c + 2A \left( \frac{\int_0^t f_n^2(\tau) d\tau}{\int_0^{T_p} f_n^2(\tau) d\tau} - \frac{1}{2} \right), \quad (9B)$$

respectively, where $\omega_{1max} = \gamma B_{1max}$, $\omega_c$ is the angular carrier frequency, and A is the amplitude of the frequency modulation. An NMR instrument can execute FM pulses by modulating the pulse phase, rather than frequency, according to the function, $$\phi(t) = \int_0^t (\omega_{RF}(\tau) - \omega_c) d\tau. \quad (10)$$

With amplitude and phase modulation, the FM pulse is described by the function $$x(t) = \omega_1(t) e^{-j\phi(t)}. \quad (11)$$

By analyzing the vector motions in a rotating frame of reference, the excitation bandwidth produced by an HSn pulse can be understood in terms of a frequency-swept excitation ($-A \leq (\omega_{RF}(t) - \omega_c) \leq A$). Accordingly, the HSn pulse bandwidth (in Hz) is theoretically given by $b_w = A/\pi$. With uniform energy distribution inside the baseband, the frequency-response profile of the HSn pulse is highly rectangular in shape, with edges becoming sharper with an increasing time-bandwidth product, $R = AT_p/\pi$.

Some features of HSn pulses can be determined by performing Bloch simulations.

Figure 6:
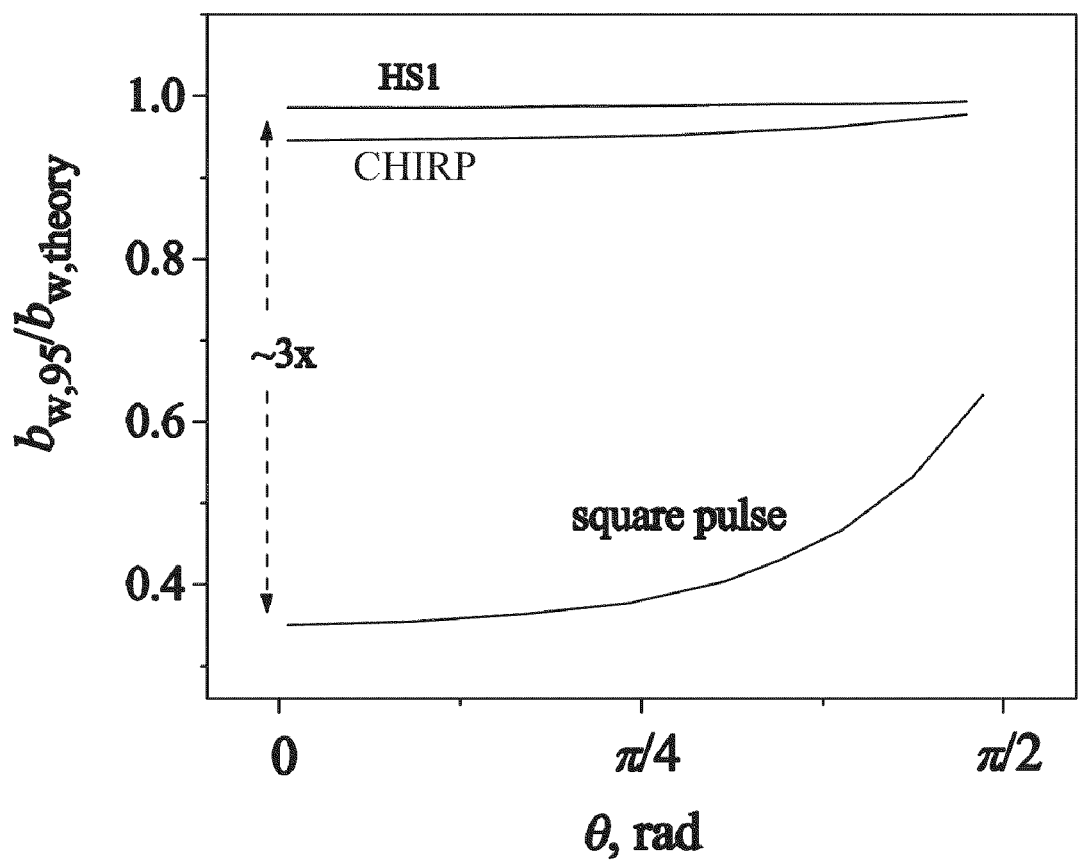
FIG. 6 illustrates a relationship between excitation bandwidth and flip angle.

FIG. 6 illustrates dependency of excitation bandwidth on the flip angle for selected pulses. For HS1 and chirp pulses $b_{w,theory} = A/\pi$ and for the square pulse $b_{w,theory} = 1/T_p$. The bandwidth dependence is displayed as the ratio between the Bloch simulations calculated bandwidth needed to achieving 95% maximal excitation and the theoretical values from linear systems considerations.

FIG. 6 shows simulated data using HS1 and chirp pulses (R=256), and for comparison, the data obtained with a simple square pulse are also shown. Bloch simulations can be used to find the bandwidth $b_{w,95}$ for which at least 95% of the maximal excitation was achieved. In FIG. 6, $b_{w,95}$ is plotted as a function of flip angle $\theta$, after normalizing by $b_{w,theory}$, which is defined as the full-width half-maximum bandwidth predicted from linear theory. In other words, $b_{w,theory} = A/\pi$ for HSn pulses and $b_{w,theory} = 1/T_p$ for a square pulse. In FIG. 6, it can be seen that the HS1 and chirp bandwidths are well approximated by the relationship $b_w \approx A/\pi = R/T_p$, for all flip angles (i.e., $b_{w,95}/b_{w,theory} \approx 1$). In comparison, the excitation bandwidth produced by a square pulse is highly dependent on the choice of flip angle. In the small flip angle region, the bandwidth of the square pulse, as predicted from Fourier analysis under estimates $b_{w,95}$ by about a factor of three. Thus, to compare with HSn pulses, the square pulse used in the following analysis will have a pulse length $T_p = 1/(3b_w)$, so that it effectively excites the same required bandwidth ($b_{w,95}$) as the HSn pulse.

In the linear region, the flip angle produced by an HSn pulse is a linear function of the RF field strength. The RF field strength expressed in terms of the spectral density at the center frequency ($j_0$) is $$j_0 = \left| \int_0^{T_p} x(t) dt \right|. \quad (12)$$

When using amplitude-modulated (AM) pulses without frequency or phase modulation (e.g., a sinc pulse), $j_0$ is a linear function of $T_p$ according to Equation 12. Alternatively, with frequency swept pulses $j_0$ can be a non-linear function of $T_p$, due to the flexibility provided by the additional parameter, R. For example, with a chirp pulse $j_0$ is inversely proportional to the square root of the frequency acceleration:

$$j_0 \propto 1/\sqrt{a} = \sqrt{(\pi T_p)/A} \approx \sqrt{T_p/b_w}. \quad (13)$$

As members of the same FM pulse family, HSn pulses are expected to exhibit similar $j_0$-dependency on $\alpha$, although with slight differences due to their altered shapes.

Figure 7:
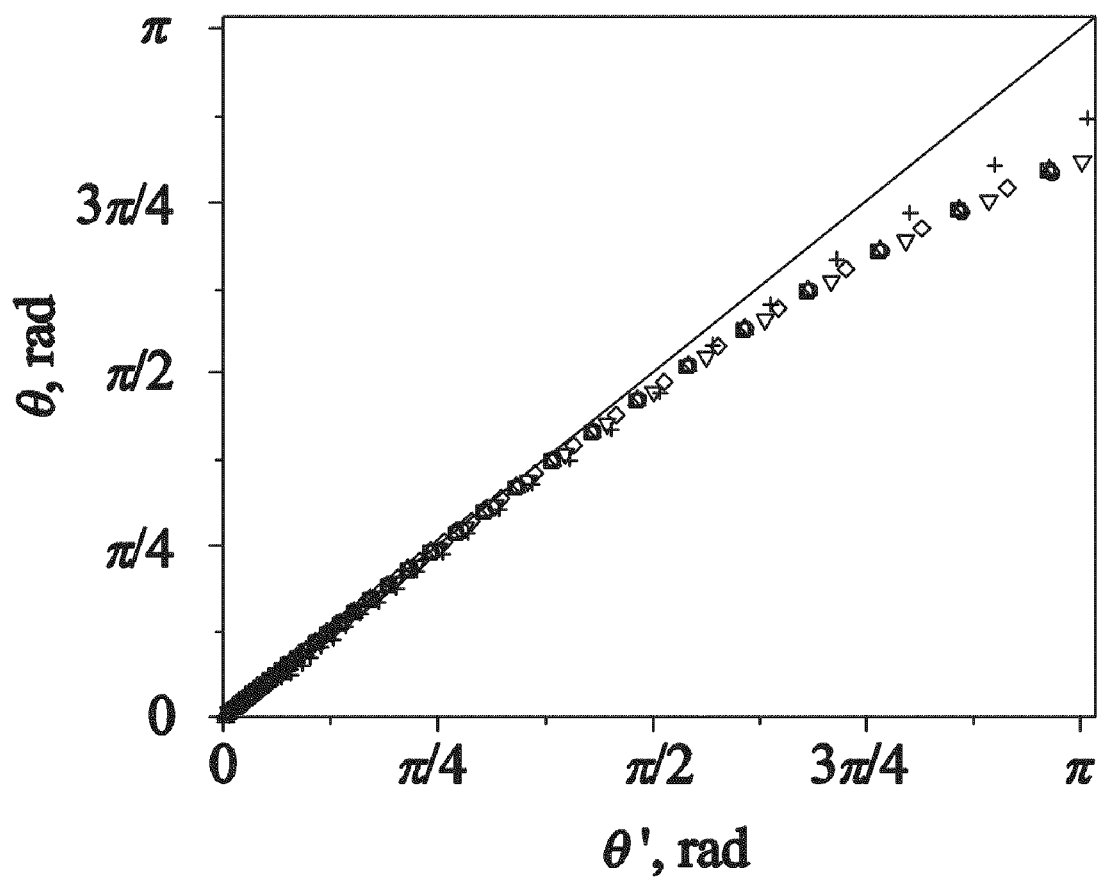
FIG. 7 illustrates a relationship between simulated and calculated flip angles.

FIG. 7 illustrates flip angles simulated for five HSn pulses with different parameters in the range of changing $\omega_{1max}$ values from 300-39000 rad/s. The different symbols represent different set of parameters n, $\beta R$, and $T_p$, which are respectively: 1, 7.6, 256, 3 ms (square), 1, 2.99, 256, 3 ms (circle), 1, 5.3 256, 1 ms (up triangle), 1, 5.3 256, 3 ms (down triangle), 8, 5.3, 256, 1 ms (diamond), and chirp with R=256 and $T_p$=2.56 ms (cross). The line represents Equations 14A-14C.

As shown in FIG. 7, results from Bloch simulations demonstrate how HSn pulses follow these expectations. In FIG. 7, the simulated flip angles ($\theta$) obtained with different settings of the pulse parameters (n, $\beta$, $T_p$, and $b_w$) are plotted on the ordinate, while the predicted flip angles ($\theta'$) based on the analytical approximation, $$\theta' = \omega_{1max} \beta^{-1/2n} \sqrt{\frac{T_p}{b_w}} \approx j_0, \quad (14A)$$

are plotted on the abscissa. Here $$\beta^{-1/2n}$$

describes the shape factor, which according to Equation 8, is related to both the relative integral and power of the pulse as $$\beta^{-1/2n} \approx \left(\frac{\pi}{2}\right)^{-1/2n} \sqrt{I(n)} \approx \sqrt{P(n)}$$

and is equal to 1 in the case of chirp. The approximation $\theta \approx \theta'$ holds for flip angles up to $\pi/2$ with an accuracy of about 3%.

Alternative equations to approximate the flip angle are $$\theta' = \omega_{1max}\beta^{-1/2n}\frac{T_p}{\sqrt{R}} \approx \theta \quad (14B)$$

and $$\theta' = \omega_{1max}\beta^{-1/2n}\frac{\sqrt{R}}{b_w} \approx \theta. \quad (14C)$$

Based on the application, a different choice of dependent versus independent parameters can be made, thus leading to using Equations 14A, 14B, or 14C. Some MRI systems implement pulses as a "shape file" having a fixed R value with the constraint of Equations 14B or 14C.

For comparison with the HSn pulses, consider a square pulse having approximately the same excitation bandwidth $b_w$. As described above, when requiring the magnitude of excited magnetization at the edges of the frequency-response profile to be at least 95% of maximum, the pulse length in the linear region is about $$\frac{1}{3b_w}$$

(see FIG. 6). The flip angle of such a square pulse with peak amplitude $\omega_{1max}$ is equal to $$\theta_{square} = \frac{\omega_{1max}}{3b_w}. \quad (15)$$

The peak amplitudes for excitation to a flip angle $\theta$ using HSn and square pulses are $$\omega_{1max}^{HSn} \approx \theta\beta^{1/2n}\sqrt{\frac{b_w}{T_p}} = \theta\beta^{1/2n}\frac{b_w}{\sqrt{R}} \quad (16)$$

and $$\omega_{1max}^{square} \approx 3b_w\theta, \quad (17)$$

respectively. In contrast to the square pulse, HSn pulses can produce the same $\theta$ and $b_w$ values with different settings of the peak RF amplitude, $$\omega_{1max}^{HSn}.$$

The relative peak amplitude required by the square and HSn pulses is given by the ratio, $$\frac{\omega_{1max}^{square}}{\omega_{1max}^{HSn}} 3\beta^{-1/2n}\sqrt{R}, \quad (18)$$

which can reach large values, depending on the R value. For example, the HS8 pulse with R=512 and $\beta$=5.3 has 61 times less peak amplitude than a square pulse exciting the same bandwidth at the same flip angle.

The relative energy, J, radiated by any RF pulse is proportional to the power and duration of the pulse. For an HSn pulse the energy is:

$$J_{HSn} = (\omega_{1max})^2 P(n) T_p \approx \left(\beta^{1/2n}\theta\sqrt{\frac{b_w}{T_p}}\right)^2 \frac{T_p}{\sqrt[n]{\beta}} = \theta^2 b_w \quad (19)$$

and accordingly for a square pulse:

$$J_{square} = (3b_w\theta)^2 T_p = 3\theta^2 b_w. \quad (20)$$

Thus, the radiated RF energy of an HSn pulse is not dependent on n, peak amplitude, or pulse length, and is at least 3 times less than the energy radiated by a square pulse exciting the same bandwidth at the same flip angle.

To generate a shaped frequency-modulated pulse, an NMR spectrometer can use a discrete representation of the pulse with a finite number of pulse elements. Consider next the total number of pulse elements ($N_{tot}$) for proper representation of the pulse. Mathematically such pulse, x'(t), can be represented as the multiplication of the continuous RF pulse function, x(t), by a comb function of spacing $\Delta t$ ($\Delta t = T_p/N_{tot}$), and convolving the result with a rectangle function having the same width $\Delta t$:

$$x'(t) = [x(t)\text{comb}(t/\Delta t)] \oplus \text{rect}(t/\Delta t), \quad (21)$$

where $\oplus$ is the convolution operation. The Fourier Transform of x'(t) represents the "low flip angle" excitation profile of the discretized pulse in a frequency (v) domain, $$X'(v) = B[X(v) \oplus \text{comb}(v\Delta t)]\text{sinc}(v\Delta t), \quad (22)$$

where $B = \Delta t^2$ is a scaling factor which may be neglected below for simplicity.

Thus, discretization creates an infinite number of sidebands having the same bandwidth $b_w$, centered at frequencies $k/\Delta t$ where k is an integer. The entire excitation spectrum is weighted by the envelope function, $$\text{sinc}(v\Delta t) = \frac{\sin(v\pi\Delta t)}{v\pi\Delta t}.$$

The Nyquist condition for a discretized excitation determines that the sidebands are not aliased when $$1/\Delta t \geq b_w. \quad (23)$$

This in turn determines the minimum number of pulse elements to satisfy the Nyquist condition, $N_{Nyquist}$, which depends on R according to:

$$N_{Nquist} = \frac{T_p}{\Delta t} = \frac{R}{b_w \Delta t} = R. \quad (24)$$

If the number of pulse elements satisfies the Nyquist condition, then the baseband $(-b_w/2 \leq v \leq b_w/2)$ can be described by $$X^{main}(v) = X(v)\text{sinc}(v\Delta t). \quad (25)$$

To reduce the attenuation by $\text{sinc}(v\Delta t)$, the length of $\Delta t$ can be decreased (i.e. the pulse can be oversampled). The parameter used to characterize the level of pulse oversampling is $$L_{over} = \frac{N_{tot}}{N_{Nyquist}} = \frac{N_{tot}}{R}. \quad (26)$$

To meet the requirement that the pulse has at least 95% maximum excitation at the edges of the baseband, $L_{over}$ must be at least 3, which is similar in form to the constraint in square pulse excitation. One example uses an even larger oversampling level.

FIGS. 8A-8J graphical present the components of Equation 24 (8A-8C, 8F-8H) and Equation 29 (8D, 8E, 8I, 8J,) for two different pulse oversampling levels $L_{over}=1$ (8A-8E) and $L_{over}=8$ (8F-8J). In the case of the gapped pulse (8D, 8E, 8I, 8J), the duty cycle, $d_c$ is equal to 0.5.

The different components of Equation 22 are presented graphically in FIGS. 8A-8J for two different pulse oversampling levels, $L_{over}=1$ (FIGS. 8A-8C) and $L_{over}=8$ (FIGS. 8F-8H). With $L_{over}=1$ the resulting excitation spectrum has its first sidebands located immediately adjacent to the baseband (FIG. 8C), and for $L_{over}=8$ the first sidebands are pushed outward to center on frequencies $\pm 8b_w$ (FIG. 8H).

In SWIFT, the transmitter is repeatedly turned on and off (every dw interval) to enable sampling "during" the pulse. Such full amplitude modulation of the excitation pulse creates modulation sidebands worthy of consideration. If the "transmitter on" time is labeled as $\tau_p$, then the time with the "transmitter off" is equal to $dw-\tau_p$. The pulse is divided into a number of segments ($N_{seg}$) each of duration dw, and the total number of sampling points ($N_{samp}$) is a multiple of $N_{seg}$:

$$N_{samp} = N_{seg} S_{over}, \quad (27)$$

where $S_{over}$ is the integer describing the acquisition oversampling. In general, the parameter $N_{seg}$ is not dependent on $N_{tot}$ with the restriction, $N_{tot} \geq 2N_{seg}$.

FIGS. 9A-9C illustrate shaped pulses with gaps for acquisition in the SWIFT sequence (FIG. 9A) and detailed structure of the pulse with different pulse oversampling levels, $L_{over}=2$ (FIG. 9B) and $L_{over}=6$ (FIG. 9C). In both examples, the pulses have a duty cycle $$d_c = \frac{\tau_p}{dw}$$

equal to 0.5. The timing of the gapped HSn pulse as used in SWIFT is presented in FIG. 9A.

There are different ways to create such segmented pulses based on the same parent pulse (Equation 11). One way is to introduce delays with zero amplitudes into the parent pulse (DANTE type) and another involves zeroing pulse elements in the parent pulse (gapped pulse). According to Bloch simulations, the excitation profile of pulses created in these two different ways are the same for $R \leq N_{seg}/2$. For the same pulse length and duty cycle, the gapped pulse shows better behavior (flatter excitation profile) up to the maximum usable R value, which is $R=N_{seg}$ (Equation 24). Consider, for example, gapped pulses.

Mathematically the gapped pulse can be described as:

$$x'_{gap}(t) = x'(t)(\text{comb}(t/dw) \oplus \text{rect}(t/\tau_p)). \quad (28)$$

The Fourier Transform of $x'_{gap}(t)$ represents the "low flip angle" excitation profile of the gapped pulse:

$$X'_{gap}(v) = X'(v) \oplus [\text{comb}(vdw)\text{sinc}(v\tau_p)]. \quad (29)$$

Figure 10A:
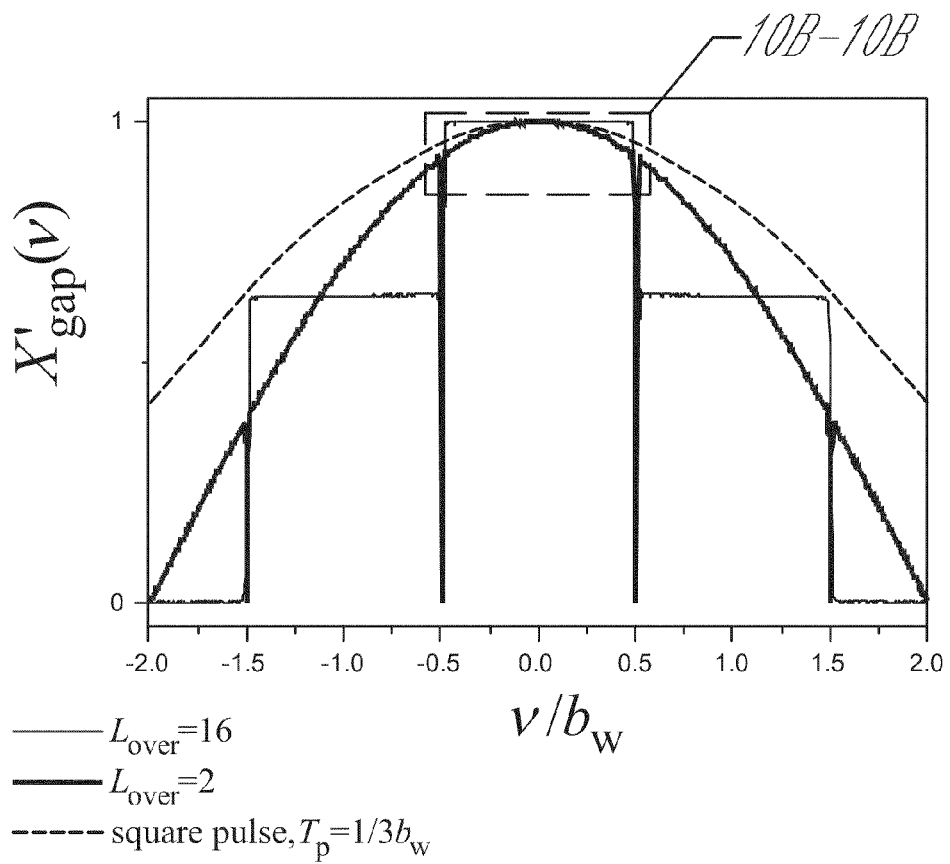
FIGS. 10A and 10B illustrate profiles of a baseband.
Figure 10B:
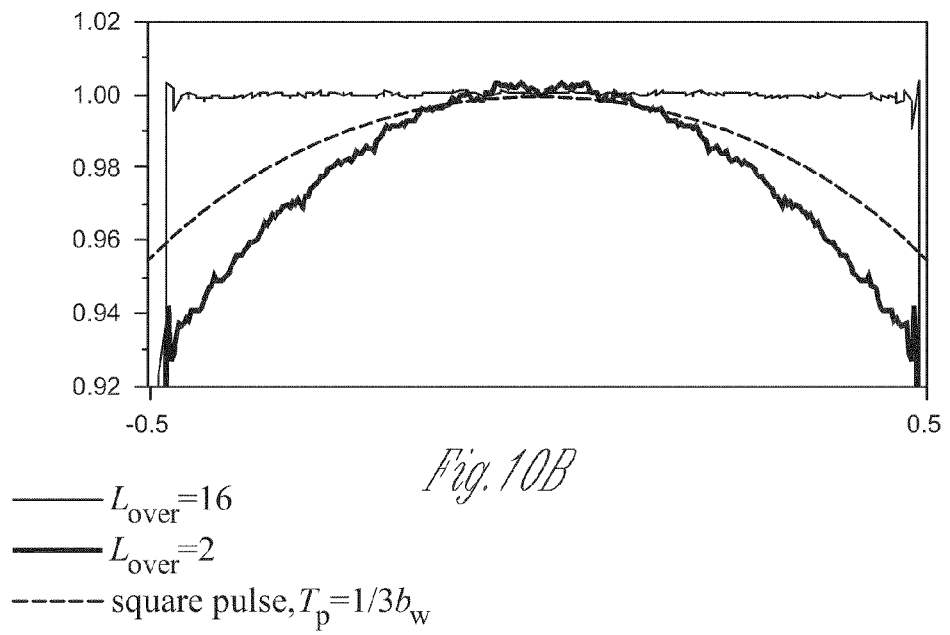
Figure 11A:
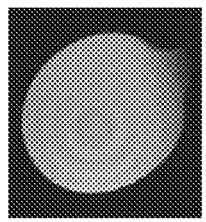
FIGS. 11A-11F illustrates sample images and phantom profiles.
Figure 11D:
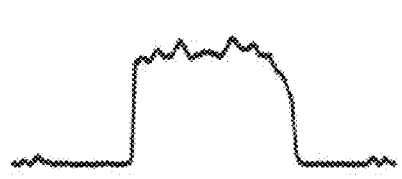
Figure 11B:
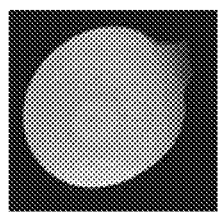
Figure 11E:
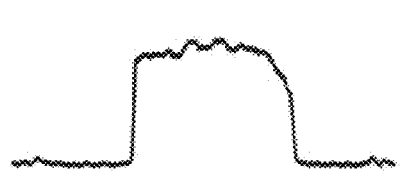
Figure 11C:
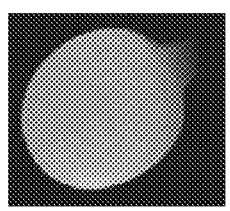
Figure 11F:
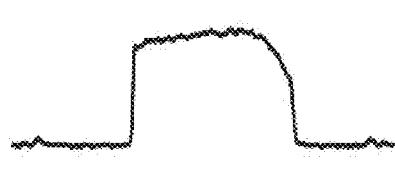

The different components of this equation are presented graphically in FIGS. 8A-8J for two different levels of pulse oversampling, $L_{over}$. Decreasing $\Delta t$ pushes the sidebands farther from the baseband, but convolution with function comb (vdw) sinc ($v\tau_p$) brings the sidebands back with amplitudes weighted by sinc ($md_c$), where m is the sideband order. As a result of this convolution, the profile of the baseband is changed by sideband contamination. FIGS. 10A and 10B show profiles of the baseband produced by gapped pulses with two different oversampling levels. Sideband contamination impairs the flatness of the profile, especially at the edges of the baseband. Increasing the level of pulse oversampling helps to decrease or eliminate this effect. This effect becomes negligible with $L_{over} \geq 16$, at which point the baseband and sideband profiles become flat with amplitudes equal to:

$$A_m = \text{sinc}(md_c). \quad (30)$$

As the duty cycle decreases ($d_c \to 0$), the amplitude of sidebands approaches the amplitude of the baseband, whereas the sidebands disappear as $d_c \to 1$.

Inserting gaps in an HSn pulse does not change the baseband excitation bandwidth and decreases the flip angle proportionally to the duty cycle. To make the same flip angle, the peak amplitude of the pulse is increased, and the resulting energy of the pulse increases by $$\frac{1}{d_c}.$$

Formulas accounting for the duty cycle are given in Table 2.

TABLE 2

Properties of gapped HSn and square pulses

| Parameter | Gapped HSn pulses ($d_c$-duty cycle) | Square pulse |
| --- | --- | --- |
| RF driving function, $f_n(t)$ | $\text{sech}(\beta(2t/T_p - 1)^n)$ | Constant |
| Relative RF integral, I(n) | $\frac{2d_c}{T_p} \int_0^{T_p} f_n(\tau) d\tau \approx d_c \left(\frac{\pi}{2\beta}\right)^{1/n}$ | $1 n \to \infty$ |
| Relative RF power, P(n) | $\frac{2d_c}{T_p} \int_0^{T_p} f_n^2(\tau) d\tau \approx d_c \left(\frac{1}{\beta}\right)^{1/n}$ | $1 n \to \infty$ |
| Total pulse length, $T_p$, s | $\frac{R}{b_w}$ | $\frac{1}{3b_w}$ |
| Amplitude modulation function, $\omega_1(t)$ | $\omega_{1max} f_n(t)[\text{comb}(b_w t) \oplus \text{rect}(b_w d_c t)]$ | $\omega_{1max}\text{rect}(t/T_p)$ |
| Frequency modulation function, $\omega_{RF}(t)$, rad/s | $\omega_c + 2A\left(\frac{\int_0^t f_n^2(\tau) d\tau}{\int_0^{T_p} f_n^2(\tau) d\tau} - \frac{1}{2}\right)$ | Constant |

TABLE 2-continued

Properties of gapped HSn and square pulses

| Parameter | Gapped HSn pulses ($d_c$-duty cycle) | Square pulse |
|---|---|---|
| Flip angle, θ, rad | $\approx \omega_{1max} d_c \beta^{-1/2n} \dfrac{\sqrt{R}}{b_w}$ | $\approx \dfrac{\omega_{1max}}{3b_w}$ |
| Peak RF amplitude, $\omega_{1max}$, rad/s | $\approx \dfrac{\beta^{1/2n}}{d_c \sqrt{R}} \theta b_w$ | $\approx 3\theta b_w$ |
| Relative RF energy, J, rad²/s | $\approx \dfrac{1}{d_c} \theta^2 b_w$ | $\approx 3\theta^2 b_w$ |
| Relative RF energy (Ernst angle), J, rad²/s | $\approx \dfrac{2 T_R b_w}{T_1 d_c}$ | $\approx \dfrac{6 T_R b_w}{T_1}$ |
| Relative SAR (Ernst angle), SAR, rad²/s² | $\approx \dfrac{2 b_w}{T_1 d_c}$ | $\approx \dfrac{6 b_w}{T_1}$ |
| Relative amplitudes of sidebands, $A_m$ | $\approx \mathrm{sinc}(m d_c)$ | — |

Consider the RF energy deposition during a particular SWIFT sequence. The maximum signal/noise (S/N) ratio is reached when the flip angle is adjusted to the "Ernst angle" ($\theta_E$), which is equal to $\theta_E = \arccos(e^{-T_R/T_1})$, where $T_R$ is repetition time and $T_1$ is longitudinal relaxation time. An approximation for the Ernst angle in rapid NMR sequences ($T_R/T_1 < 0.1$) is:

$$\theta_E \approx \sqrt{\dfrac{2 T_R}{T_1}}. \tag{31}$$

In this case, the relative energy deposition according to Equation 19 is equal to:

$$J_{HSn} \approx \dfrac{2 T_R b_w}{T_1 d_c}, \tag{32}$$

and the relative SAR for the HSn pulses is:

$$SAR_{HSn} \approx \dfrac{2 b_w}{T_1 d_c}, \tag{33}$$

and for a square pulse is:

$$SAR_{square} \approx \dfrac{6 b_w}{T_1}. \tag{34}$$

Thus, the energy and SAR of a gapped HSn pulse at the Ernst angle is independent of pulse length, R value, and the specific pulse shape (n), and is linearly proportional to pulse baseband width. As compared with a square pulse producing the same bandwidth ($b_{w,95}$), HSn pulses have reduced SAR when the duty cycle ($d_c$) is large and greater SAR when $d_c < 0.33$.

Note that in general, with decreasing pulse duty cycle, the S/N increases together with the SAR, which under certain circumstances leads to a compromise in the choice of "optimum" duty cycle.

In SWIFT, useful signal is extracted by correlation of the spin system response with the pulse function. A misrepresentation of the pulse function will result in a systematic error in the resulting spectrum. Such a systematic error in radial imaging shows up in the reconstructed image as a "bullseye" artifact. To avoid such artifacts, the pulse function used for correlation should be as faithful as possible to the physical pulse transmitted by the RF coil. Some errors can be predicted and neutralized on a software level:

1. Gapping effects. For correlation, instead of the theoretical function, $x(t)$, the discretized function $x'_{gap}(t)$, is used.
2. Digitization. The function, $x'_{gap}(t)$, can be rounded by software and hardware.
3. Timing errors. To avoid temporal rounding error the pulse element duration $\Delta t$ can be equal to or be a multiple of the minimum time step (temporal resolution) of the waveform generator.

FIG. 10 illustrates simulated profiles of the baseband for a gapped HS1 pulse ($d_c$ is equal to 0.5) with two different oversampling levels and for a square pulse of $$\dfrac{1}{3 b_w}$$

duration (FIG. 10A). Zoomed in plots of the top of the baseband are shown in FIG. 10B. The figure shows plots of excitation profiles obtained by FT of the pulse functions. Gapped HSn pulses can be defined using the digital word lengths permitted by the Varian Inova spectrometer (Palo Alto, Calif.) used for SWIFT experimentation. For example, to create the pulse function $x'_{gap}(t)$, the amplitude and phase values of the parent HS1 pulse can be rounded to 10 and 9 bit length words, respectively. The excitation profiles shown in FIG. 10 exhibit high frequency "noise" (~0.5% of peak amplitude) which results from rounding amplitude and phase values. By including all discretization constraints in the pulse function before correlation, most of this "noise" contamination can be removed. The latter procedure removes most effects from pulse imperfections. Furthermore, in SWIFT acquisitions using fast repetition of excitation pulses, the complex interplay between the "noisy" profile and the variable recovery of the longitudinal magnetization can lead to additional image artifacts. In this case, correlation may remove the static part of this "noise", but the remainder will appear as a "bullseye" artifact in the resulting image.

Examples of the effects of pulse imperfections on water phantom and human head images are shown on FIGS. 11 and 12, respectively. Three-dimensional SWIFT images can be reconstructed from frequency-encoded radial projections using gridding without any filtering or other corrections.

FIGS. 11A-11F illustrate selected slices of 3D SWIFT images (11A, 11B, 11C) and their profiles (11D, 11E, 11F) (horizontal, through center) of a water phantom acquired using HS1 pulse (R=256, $d_c$=0.375) with three different levels of pulse oversampling, $L_{over}=2$ (11A, 11D), $L_{over}=4$ (11B, 11E) and $L_{over}=16$ (11C, 11F). Other parameters: diameter of FOV=3 cm, $b_w$=62.5 kHz, $\tau_p$=6 μs, θ≈44°, TR=4.1 ms, $N_{seg}$=256 complex points in radial direction, the total number of radial spokes 16384 (including positive and negative gradient direction), 0.12 mm isotropic voxel size.

Figure 12A:
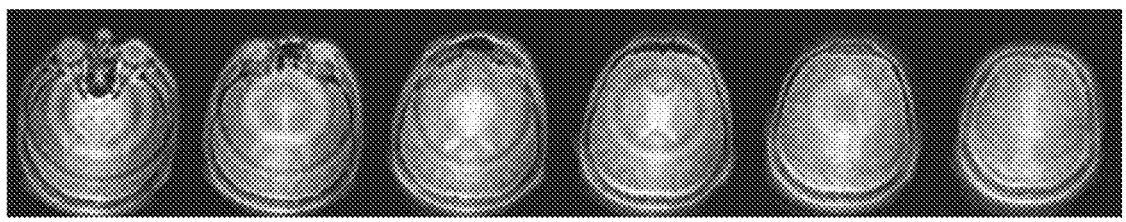
FIGS. 12A and 12B illustrate selected images.
Figure 12B:
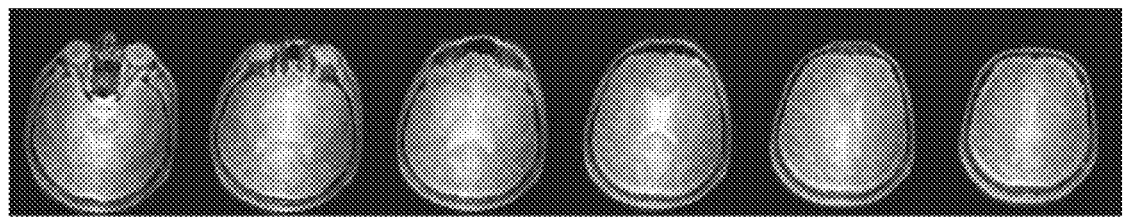

The figures present images and their profiles (horizontal, through the center) of the water phantom acquired with three different levels of oversampling (2, 4 and 16). The differences between images reflect the level of pulse oversampling used. The bullseye artifact decreases with increasing oversampling of the pulse. A similar effect is observed in human head images as shown in FIG. 12. In FIG. 12, two datasets were separately acquired corresponding to $L_{over}=2$ (FIG. 12A images) and $L_{over}=32$ (FIG. 12B images). Selected orthogonal slices are shown. The upper images show a noticeable bullseye artifact, which is almost invisible on the bottom images obtained using the oversampled pulse. The figures show selected axial slices of 3D SWIFT images of human brain acquired using HS1 pulse (R=256, $d_c$=0.5) with different levels of pulse oversampling, Other parameters: diameter of FOV=40 cm, $b_w$=31 kHz, $\tau_p$=16 μs, θ≈10°, $T_R$=8.5 ms, $N_{seg}$=256 complex points in radial direction, the total number of radial spokes 32000 (including positive and negative gradient direction), 1.6 mm isotropic voxel size and the total acquisition time was 4.5 min.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventors also contemplate examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A method comprising:
    receiving image data from an imaging modality, the image data including an image artifact and a measured projection of an object, the measured projection corresponding to a radially distributed view;
    using the image data and a processor, determining a ratio of an average projection and a filtered average projection; and
    calculating corrected data using the ratio and the image data, the corrected data corresponding to a corrected image of the object, the corrected image having a decreased image artifact.

2. The method of claim 1 further including pre-compensating the image data using a factor including an inverse of time.

3. The method of claim 1 wherein calculating corrected data includes at least one of calculating a product and calculating a convolution.

4. The method of claim 1 wherein receiving image data includes receiving magnetic resonance data.

5. The method of claim 4 further including estimating a persistent distortion in a magnetic resonance excitation signal.

6. The method of claim 5 wherein estimating the persistent distortion includes using a Fourier transform (FT).

7. The method of claim 4 wherein receiving magnetic resonance data includes providing an adiabatic excitation pulse to the object.

8. The method of claim 7 wherein receiving magnetic resonance data includes receiving data generated using SWIFT protocol.

9. The method of claim 1 wherein receiving image data includes measuring a system response independent of an excitation signal provided to the object.

10. The method of claim 9 further including using a sniffer coil to measure the system response.

11. The method of claim 9 further including using a sample port to measure the system response.

12. The method of claim 1 wherein determining the ratio includes determining the filtered average projection using a band pass filter.

13. The method of claim 12 wherein determining the filtered average projection using the band pass filter includes using a low pass filter.

14. The method of claim 12 wherein using the band pass filter includes using at least one of a Gaussian filter and a polynomial filter.

15. The method of claim 1 wherein determining the ratio includes performing spline interpretation.

16. The method of claim 1 further including generating a corrected image using the corrected data.

17. A system comprising:
a memory configured to receive image data corresponding to a radial projection of an object, the image data including an image artifact; and
a processor coupled to the memory, the processor configured to determine a ratio of an average projection and a filtered average projection using the image data and configured to calculate corrected data using the ratio and the image data, the corrected data corresponding to a corrected image of the object, the corrected image having a decreased image artifact.

18. The system of claim 17 wherein the processor is configured to calculate corrected data using at least one of multiplication in a frequency domain and convolution in a time domain.

19. The system of claim 17 further including a display coupled to the processor and configured to render a visible image of the object using the corrected data.

20. The system of claim 17 wherein the processor is configured to execute an algorithm to estimate a persistent distortion in an excitation signal provided to the object.

21. The system of claim 17 wherein the processor is configured to implement a band pass filter.

22. The system of claim 17 wherein the processor is configured to implement a low pass filter.

23. A non-transitory machine-readable medium having machine executable instructions stored thereon that, when the instructions are executed, cause one or more processors to perform operations including:
receiving image data from an imaging modality, the image data including an image artifact and a measured projection of an object, the measured projection corresponding to a radially distributed view, the image data stored in a computer memory;
determining an average projection using the image data;
determining a filtered average projection using the image data;
calculating a correction factor using a processor, the average projection and the filtered average projection; and
adjusting the image data using the correction factor, the adjusted image data having a decreased image artifact.

24. The machine-readable medium of claim 23 wherein receiving the image data includes receiving magnetic resonance data corresponding to an adiabatic pulse.

25. The machine-readable medium of claim 23 wherein determining the filtered average projection includes estimating.

26. The machine-readable medium of claim 23 wherein determining the filtered average projection includes implementing a band pass filter.

27. The machine-readable medium of claim 23 wherein determining the filtered average projection includes implementing a polynomial filter.

28. The machine-readable medium of claim 23 wherein adjusting the image data includes adjusting an image intensity.

29. The machine-readable medium of claim 23 wherein receiving the image data includes receiving magnetic resonance data generated using SWIFT protocol.

30. The machine-readable medium of claim 23 wherein adjusting the image data includes at least one of multiplying in a frequency domain and convoluting in a time domain.

* * * * *